US010476252B2

(12) United States Patent
Lim et al.

(10) Patent No.: US 10,476,252 B2
(45) Date of Patent: Nov. 12, 2019

(54) ARC FAULT CIRCUIT INTERRUPTER (AFCI) WITH ARC SIGNATURE DETECTION

(71) Applicant: Ze Chen, Yueqing, Zhejiang Province (CN)

(72) Inventors: Boon Lum Lim, Singapore (SG); Samuel Raj, Singapore (SG)

(73) Assignee: Ze Chen, Yueqing (CN)

( * ) Notice: Subject to any disclaimer, the term of this patent is extended or adjusted under 35 U.S.C. 154(b) by 235 days.

(21) Appl. No.: 15/269,513

(22) Filed: Sep. 19, 2016

(65) Prior Publication Data
US 2018/0083434 A1 Mar. 22, 2018

(51) Int. Cl.
| H02H 1/00 | (2006.01) |
| G01R 19/02 | (2006.01) |
| G01R 19/04 | (2006.01) |
| G01R 31/02 | (2006.01) |
| H02H 3/38 | (2006.01) |
| H02H 3/16 | (2006.01) |
| H01H 71/04 | (2006.01) |
| H01H 71/62 | (2006.01) |
| H01H 83/04 | (2006.01) |
| H01H 71/58 | (2006.01) |
| H01H 83/20 | (2006.01) |

(52) U.S. Cl.
CPC ........... *H02H 1/0015* (2013.01); *G01R 19/02* (2013.01); *G01R 19/04* (2013.01); *G01R 31/024* (2013.01); *H01H 71/04* (2013.01); *H01H 71/62* (2013.01); *H01H 83/04* (2013.01); *H02H 3/16* (2013.01); *H02H 3/38* (2013.01); *H01H 71/58* (2013.01); *H01H 2071/044* (2013.01); *H01H 2083/201* (2013.01)

(58) Field of Classification Search
CPC ....... H02H 1/0015; G01R 19/02; G01R 19/04
See application file for complete search history.

(56) References Cited

U.S. PATENT DOCUMENTS

| 5,729,145 | A | * | 3/1998 | Blades | ............... G01R 31/1272 324/522 |
| 8,779,875 | B2 | | 7/2014 | Chen | |
| 8,847,712 | B2 | | 9/2014 | Chen | |
| 2005/0264962 | A1 | * | 12/2005 | Kim | ...................... H02H 1/0015 361/42 |
| 2007/0030608 | A1 | * | 2/2007 | Baldwin | ................ H01H 83/04 361/42 |

(Continued)

FOREIGN PATENT DOCUMENTS

CN 201210024531.5 2/2012

*Primary Examiner* — Scott Bauer
(74) *Attorney, Agent, or Firm* — Mei & Mark LLP

(57) ABSTRACT

In one example, an arc fault circuit interrupter (AFCI) is provided. The AFCI may include a plurality of current arc signature detection blocks configured to output a plurality of corresponding current arc signatures, and a processor. The processor may be configured to receive each of the plurality of current arc signature from each of plurality of current arc signature detection blocks, respectively, and generate a first trigger signal. The processor may be further configured to assess each of the current arc signatures, determine whether an arc fault exists based on the assessment, and generate the first trigger signal if an arc fault is determined to exist. A method for detecting an arc fault is also provided.

27 Claims, 23 Drawing Sheets

(56) References Cited

U.S. PATENT DOCUMENTS

2008/0129307 A1* 6/2008 Yu .................... H02H 1/0015
 324/522
2010/0060469 A1* 3/2010 Hetzmannseder ..................
 G01R 31/3272
 340/639

* cited by examiner

ARC FAULT CIRCUIT INTERRUPTER (AFCI) WITH ARC SIGNATURE DETECTION

TECHNICAL FIELD

The present disclosure relates to apparatuses, systems, and algorithmic methods for extracting and detecting of the signatures of potential arc faults in an AFCI (Arc Fault Circuit Interrupter), and subsequently determining the presence of an arc fault condition using combination decision logic. Further, the present disclosure relates to an innovative arc fault signature processing and detection of a combination or standalone parameters of a time-domain characteristic and multi-pulse arc signatures. Further, this disclosure pertains to a periodic automatic self-testing procedure for generating such signatures, a force triggering mechanism for self or manual trip testing, and triggering solutions to provide a fast and easy mechanical trip procedure. Further, this disclosure pertains to detection of end-of-life (EOL) conditions for an AFCI apparatus, and the consequent commencement of a non-reversible EOL state.

BACKGROUND

Conventional earth current leakage circuit breakers and over-current fuses are commonly deployed to prevent injuries to people and property from dangerous conditions resulting from, for example, current leakages or severe current arcs. Although such devices detect the occurrence of some electrical faults to prevent harm to persons and property, even when such conventional devices are employed, certain electrical faults are not detected. For example, as conventional devices lack intelligent characteristic and physical fault signature identification, certain current arc occurrences might not be detected: This presents potential fire hazards.

A current arc is typically caused by a current surging over separated or poorly contacting electrical surfaces within electrical equipment, for example, in its power cord or in an electrical device itself; or within damaged electrical wiring, such as, within the walls of a building. Current arc electrical faults may be defined as current through ionized gas between the two (e.g., supply-side and load-side) separated or poorly contacting electrical surfaces. Such current arcs are often characterized by sparking and extremely high heat, and as a result can cause electrical fires. For example, electrical fires may start when the heat and/or sparking of a current arc causes insulating material or construction material in the vicinity of the electrical fault to combust. Current arc-caused electrical fires may damage property or even endanger human life.

Unfortunately, conventional circuit breakers, fuses, or Ground Fault Circuit Interrupter (GFCI) protection devices typically cannot detect—and consequently halt—current arc electrical faults, unless a current arc produces sufficient current leakage to the electrical ground to be detected by a GFCI and/or results in a sufficient current imbalance to be detected by leakage current coil circuit. Typically, an arc fault does not involve current leaking to a ground conductor or any conducting devices to the ground; it is therefore unlikely to result in a substantial current imbalance between the supply and the load.

Underwriters Laboratories (UL), an American Worldwide Safety Consulting and Certification Organization, characterizes arc faults into two fundamental types, series arc faults and parallel arc faults. Parallel arcing typically refers to arcing that occurs between two conducting wires, or between a conductor and the ground. That is, the electrical fault may be in parallel with the electrical load. The instantaneous current of a parallel arc may be limited by, for example, the impedance of the voltage source, the properties of the wiring, and the nature of surfaces where the arc occurs. When such a parallel arc occurs, a conventional circuit breaker may trip very quickly, reducing the likely of damage caused by heating of the conducting wire or fire damage at the arc occurrence point. However, there are instances where a parallel arc may destroy faulted components and thereby create a large parallel arc voltage. Under such circumstances, the arc fault current may be below the tripping point of conventional current protection devices. Thus, such a dangerous parallel arc may avoid detection, and ultimately cause an electrical fire or other dangerous situation.

Series arcing typically refers to arcing that occurs between an electrical supply and an electrical load. That is, the electrical fault may be in series with the electrical load. This may be caused by, for example, corrosion in a pin-socket or a loose connection in contacting surfaces. For example, a series arc may be initially characterized by a voltage drop of, for example, a magnitude of several hundred mV across a poorly contacting connection, which may gradually heat up, oxidize, and/or pyrolize the materials or structure surrounding the electrical fault. If the series arc fault is permitted to persist, its voltage drop may increase to a magnitude of a few volts, consequently resulting a more dramatic increase in temperature, which may cause a release of smoke from surrounding polymer insulation and/or a fire. Generally, the current of a series arc is typically limited to a moderate value by the impedance of the electrical load of the circuit. As such, the peak current of a series arc might typically never exceed the design load current of an appliance providing an electric load, making the detection of a series arc fault particularly difficult. Thus, while the amount of power generated by series arc fault is typically less than that of a parallel arc fault, the detection of series arc faults poses additional challenges.

Therefore, there is a need to be able to identify and detect potential current arc electrical faults, and subsequently interrupt the connecting circuit to prevent potential current arc fire hazards. An apparatus that addresses arc faults may be referred to as an Arc Fault Circuit Interrupter (AFCI). Despite the existence of conventional AFCIs, there remains room for improvement in the technology. In order to accurately identify, detect, and halt dangerous arc faults, there remains a need to automatically classify potential arc current patterns and cause a circuit tripping mechanism to terminate the supply of electrical current when appropriate. Additionally, there remains a need for a tripping mechanism to support ensure a proper, flexible trip operation in time desired. There further remains a need for such a tripping mechanism to provide automatic and/or manual testing functionality to ensure that the AFCI and/or other electrical protection devices work properly.

It may be desirable that a successful detection of an arc fault conduction activates a tripping mechanism to enable a tripped state, wherein an AFCI apparatus is placed in an off or non-conductive state. It may also be desirable that an AFCI apparatus may detect an end-of-life (EOL) condition and consequently engage a permanent EOL state, where an AFCI is tripped and no further reset operation is possible.

SUMMARY

The present disclosure provides a description of apparatuses, systems, and methods to address the perceived needs and desires described above.

In one example, an AFCI is provided. The AFCI may include a plurality of current arc signature detection blocks configured to output a plurality of corresponding current arc signatures, and a processor. The processor may be configured to receive each of the plurality of current arc signature from each of plurality of current arc signature detection blocks, respectively, and generate a first trigger signal. The processor may be further configured to assess each of the current arc signatures, determine whether an arc fault exists based on the assessment, and generate the first trigger signal if an arc fault is determined to exist.

In another example, the AFCI may further include a relay module configured to trip the arc fault circuit interrupter in response to the first trigger signal, and a reset button module configured to place the tripped arc fault circuit interrupter back into an operating condition.

In yet another example, the AFCI may further include a force trigger testing mechanism configured to trip the arc fault circuit interrupter, and a test button configured to activate the force trigger testing mechanism.

In yet another example, the plurality of current arc signature detection blocks may include a time domain signature block configured to generate a time-domain signature and the plurality of corresponding current arc signatures may include the time-domain signature. The processor may be further configured to determine that the arc fault does not exist if a duty cycle of the time-domain signature is below a predetermined duty-cycle threshold.

In yet another example, the plurality of current arc signature detection blocks may include a multi-pulse detection block configured to generate a pulse signature and the plurality of corresponding current arc signatures may include the pulse signature. The processor may be further configured to determine that the arc fault does not exist if the pulse signature is not characterized by a multi-pulse phenomenon for a pulse assessment period. The pulse assessment period may extend for at least one AC period.

In yet another example, the plurality of current arc signature detection blocks may include an RMS voltage/current measurement block configured to generate a RMS current signature and the plurality of corresponding current arc signatures may include the RMS current signature. The processor may be further configured to determine that the arc fault does not exist if the RMS current signature does not exceed a predetermined RMS current amplitude threshold for an RMS assessment period. The RMS assessment period may extend for at least two AC periods.

In yet another example, the RMS voltage/current measurement block may be further configured to generate a RMS voltage signature. If the processor determines that the arc fault exists, the processor is further configured to determine that the arc fault is a parallel arc fault if the amplitude of the voltage signature is above a predetermined RMS voltage amplitude threshold and determine that the arc fault is a series arc fault if the amplitude of the voltage signature is below the predetermined RMS voltage amplitude threshold.

In yet another example, the plurality of current arc signature detection blocks may include a time domain signature block configured to generate a time-domain signature, a multi-pulse detection block configured to generate a pulse signature, and an RMS voltage/current measurement block configured to generate a RMS current signature. The plurality of corresponding current arc signatures may include time-domain signature, the pulse signature, and the RMS current signature.

In yet another example, the processor may be configured to determine that an arc fault exists if there conditions are met. These conditions are (1) that a duty cycle of the time-domain signature is below a predetermined duty-cycle threshold, (2) that the RMS current signature exceeds a predetermined RMS current amplitude threshold for an RMS assessment period; and (3) that the pulse signature is characterized by a multi-pulse phenomenon for a pulse assessment period.

In yet another example, the duty cycle of the time-domain signature may be assessed after the pulse signature is assessed.

In yet another example, the processor may be further configured to administer a self-test at start-up and cyclically on a self-test interval to determine if the arc fault circuit interrupter is in an end-of-life condition. The processor may be configured to generate the first trigger signal and a second trigger signal if the arc fault circuit interrupter is in the end-of-life condition. The self-test interval may be between 1 and 3 hours.

In yet another example, the AFCI may further include a relay module and a safety lock coil module. The relay module may be configured to trip the AFCI in response to the first trigger signal. The lock coil module may be configured to place a tripped AFCI in an end-of-life state in response to the second trigger signal.

In yet another example, the AFCI may further include a reset button module configured to place the AFCI back into an operating condition if the AFCI is tripped and not in the end-of-life state.

In yet another example, the AFCI may further include a force trigger testing mechanism and a test button. The force trigger testing mechanism may be configured to trip the arc fault circuit interrupter. The test button may be configured to activate the force trigger testing mechanism.

In yet another example, the processor may be further configured to administer a self-test to determine if the arc fault circuit interrupter is in an end-of-life condition by (1) providing an arc simulation signal to the multi-pulse detection block, (2) assessing the pulse signature corresponding the arc simulation signal, and (3) determining that the arc fault circuit interrupter is in an end-of-life condition if the pulse signature corresponding the arc simulation signal is not characterized by a multi-pulse phenomenon for a pulse assessment period. The processor may be further configured to generate the first trigger signal and a second trigger signal if the arc fault circuit interrupter is in the end-of-life condition.

In yet another example, the AFCI may further include an LED. The processor may be further configured to monitor the operating conditions on a monitoring interval to determine if there is an abnormal operating condition, and provide a signal to the LED if the abnormal operating condition is determined to exist. The monitoring interval may be between 10 and 15 minutes.

In yet another example, the AFCI may further include a leakage detection circuit configured to output a leakage detection signal to the processor. The processor may be further configured to generate the first trigger signal if the leakage detection signal is received.

In one example, a method for detecting an arc fault is provided. A plurality of current arc signatures may be received. Each of the current arc signatures may be assessed to determine whether the arc fault exists. If the arc fault is determined to exist a trigger signal may be generated.

In another example, a time-domain signature may be received. It may be determined that an arc fault does not exist if a duty cycle of the time-domain signature is below a predetermined duty-cycle threshold.

In another example, a pulse signature may be received. It may be determined that an arc fault does not exist if the pulse signature is not characterized by a multi-pulse phenomenon for a pulse assessment period.

In yet another example, an RMS current signature may be received. It may be determined that an arc fault does not exist if the RMS current signature does not exceed a predetermined RMS current amplitude threshold for an RMS assessment period.

In yet another example, an RMS voltage signature may be received. If an arc fault has been determined to exist, it may be determined that the arc fault is a parallel arc fault if the amplitude of the voltage signature is above a predetermined RMS voltage amplitude threshold and it may be determined that the arc fault is a series arc fault if the amplitude of the voltage signature is below the predetermined RMS voltage amplitude threshold.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate certain embodiments of the present disclosure and together with the description, serve to explain the principles of this disclosure.

DETAILED DESCRIPTION

Reference will now be made in detail to the present exemplary embodiments, examples of which are illustrated in the accompanying drawings. Wherever possible, the same reference numbers will be used throughout the drawings to refer to the same or like parts. While the description includes exemplary embodiments, other embodiments are possible, and changes may be made to the embodiments described without departing from the spirit and scope of the invention. The following detailed description does not limit the invention. Instead, the scope of the invention is defined by the appended claims and their equivalents.

Figure 2A:
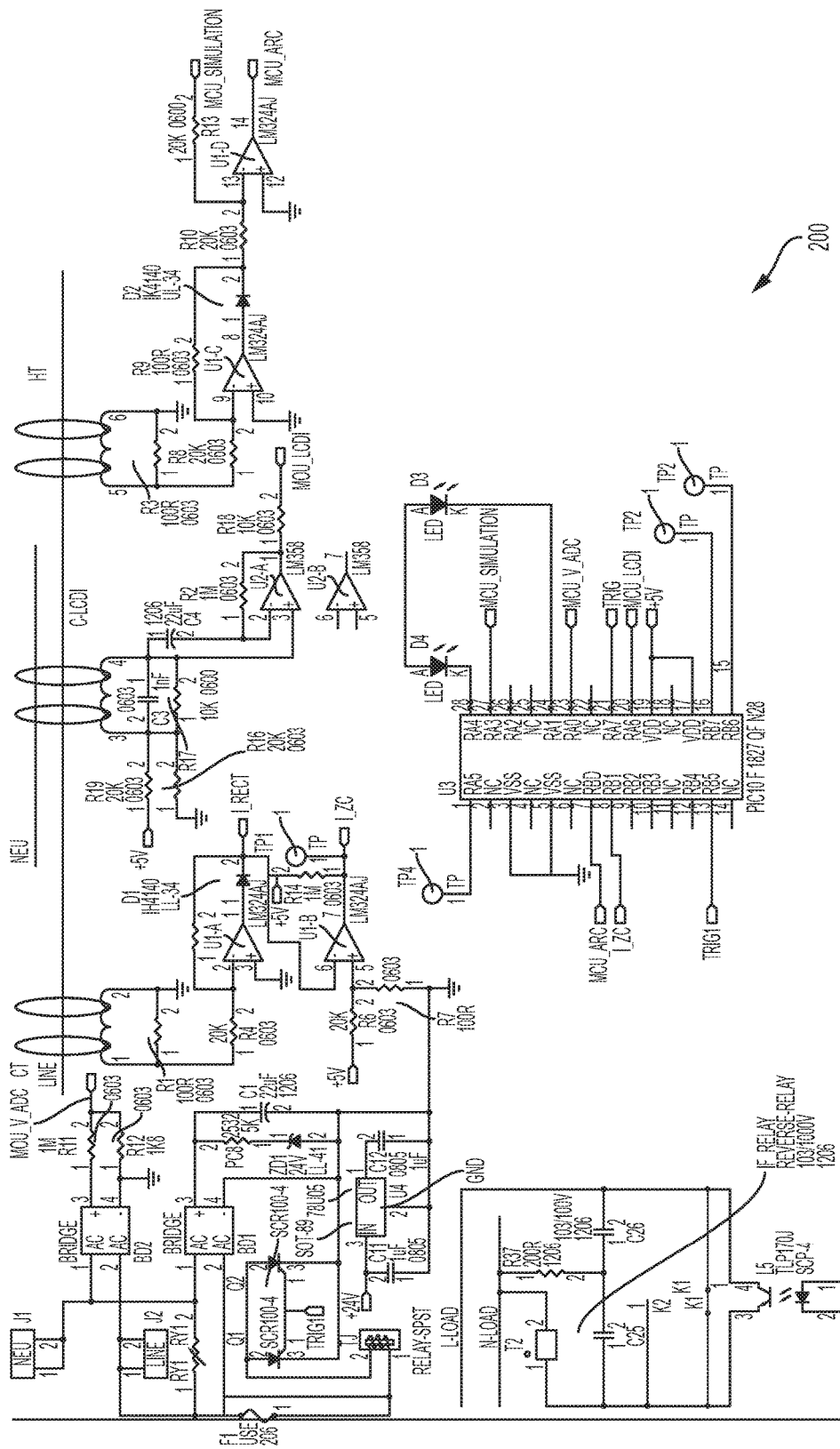
FIGS. 2A-2H depict a circuit diagram of an embodiment of AFCI circuitry of the present disclosure, and portions thereof.

FIG. 2A depicts an exemplary circuit schematic for AFCI circuit 200. It includes time-domain signature detection block 202 (depicted in detail in FIG. 2B) to generate a time-domain signature; multi-pulse detection block 203 (depicted in detail in FIG. 2C) to generate a pulse signature; and RMS voltage/current measurement block 204 (depicted in detail in FIG. 2D) to generate RMS voltage and/or current signatures. Consistent with this disclosure, the generated signatures may be processed and analyzed by a central processing unit, for example, microcontroller/processor (MCU) 205 (depicted in detail in FIG. 2E), to determine the presence of and/or classify any current arc fault. Subsequent to such determination or clarification, MCU 205 may, as appropriate, trigger an alarm and/or alert, and/or engage a tripping mechanism to halt the supply of power to the circuit load.

MCU 205 may, in some embodiments, accomplish the functions described herein by executing a computer program stored on a non-transitory computer readable storage medium. Such computer readable storage medium may be included within MCU 205, external to MCU 205, or partially within and partially external to MCU 205.

The arc fault detection and circuit interruption operation of exemplary AFCI circuit 200 is described below.

Figure 2B:
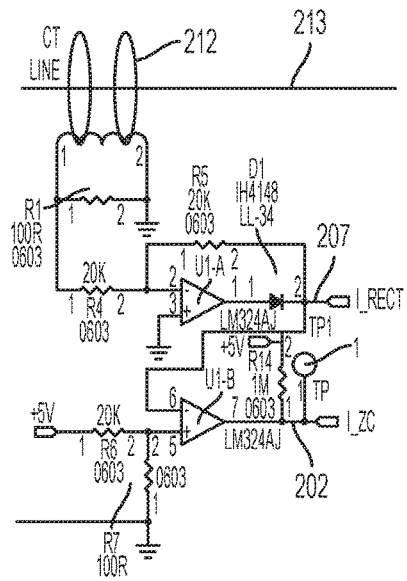

With reference to FIG. 2B, the line current input passes through the LC coil 212. Preferably, LC coil is a low frequency response coil structure. It may identify and capture low frequency characteristics of the input line current. The time-domain signature may be derived, in part from these characteristics.

Figure 3A:
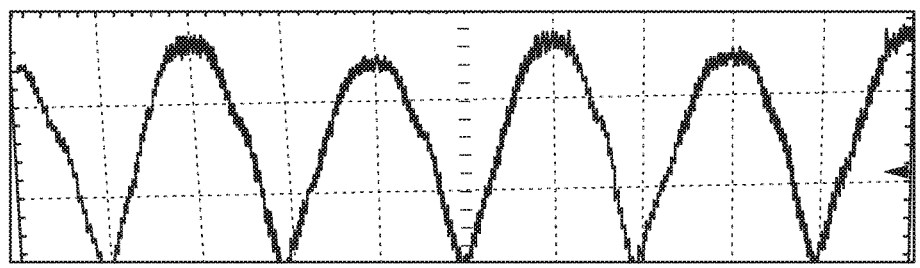
FIGS. 3A-3K are illustrations of measured and simulated waveforms of an embodiment of AFCI circuitry of the present disclosure under various conditions.
Figure 3B:
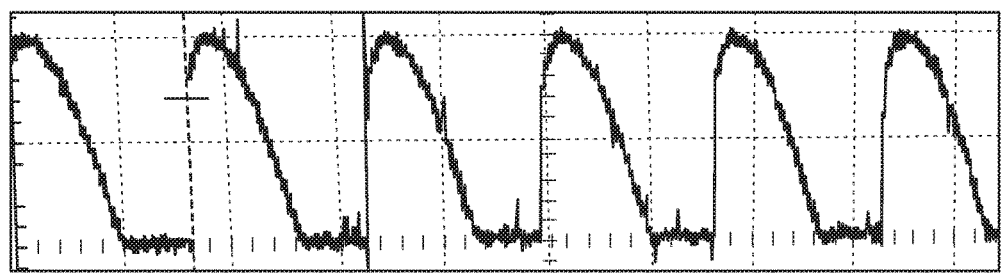

First rectification bridge 217 may generate a single-sided current waveform from the LC coil, which may preferably be used in generating the time-domain signature. FIG. 3A depicts a typical single-sided current waveform measured at point I_RECT, which is the output of first rectification bridge 217, under normal operating conditions. FIG. 3B, however, depicts a typical single-sided current waveform measured at point I_RECT during arc occurrence.

Figure 3C:
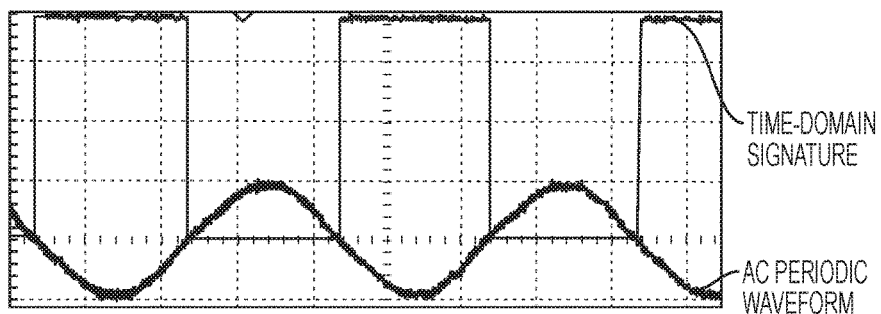

A time-domain signature may be captured by time-domain signature detection block 212 by converting the single-sided current waveform into a rectangular waveform, for example by identifying the shoulder of the single-sided current waveform. FIG. 3C depicts a rectangular waveform at point I_ZC under normal operating conditions, which corresponds to the single-sided current waveform of FIG. 3A (measured at point I_RECT). For illustrative purposes, the single pulse waveform of FIG. 3C is overlaid with a periodic waveform that illustrates the relative periodic timing of the AC signal of the power supply. For example, as depicted, it may be observed that the duty cycle of each period of the rectangular wave is approximately 50% during normal operation.

Figure 3D:
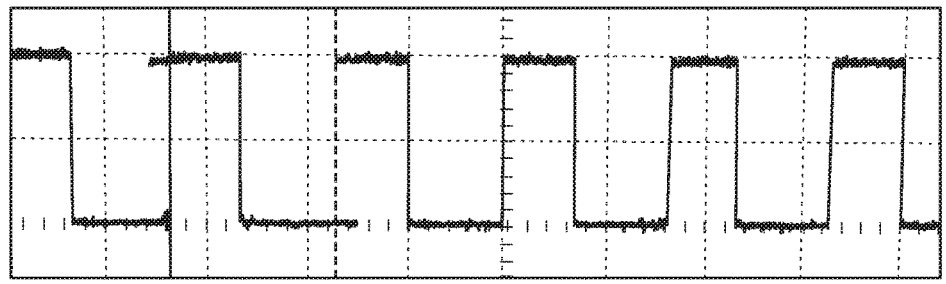

FIG. 3D depicts a rectangular waveform at point I_ZC during arc occurrence, which corresponds to the single-sided current waveform of FIG. 3B (measured at point I_RECT). As depicted, it may be observed that the duty cycle of each period of the rectangular wave is measurably less than 50%.

During operation, MCU 215 may calculate an average duty cycle of the rectangular waveform at point I_ZC for a predefined running window for arc signature processing, for example 4.5-5 periods of the AC power supply signal as to comply with UL specifications. Beyond a predetermined error threshold, a difference between the average duty cycle for the running window and that of a predetermined normal average duty cycle (e.g., 50%) may serve as a factor that indicates arc fault occurrence.

Figure 2C:
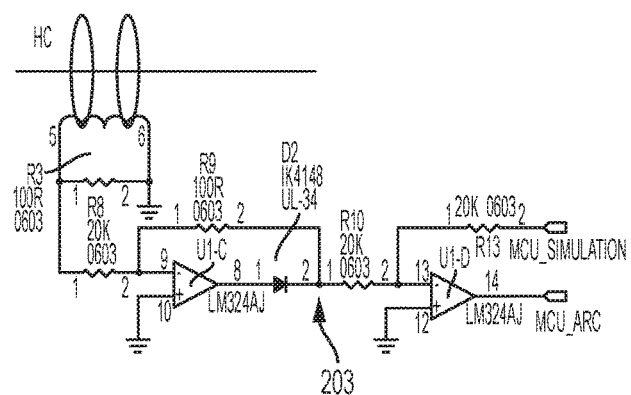

With reference to FIG. 2C, the line current input also passes through the HC coil 214 of multi-pulse detection block 3. HC coil 214 is a high frequency response coil structure, and may be used to identify a multi-pulse high frequency response signature of an arc occurrence. The measured signal may be captured at point MCU_ARC, which is provided to MCU 215 for decision processing.

Figure 3E:
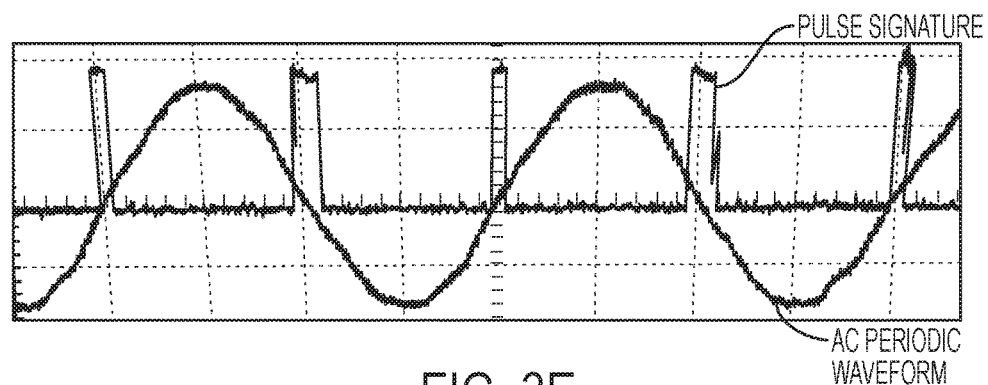

FIG. 3E illustrates a single pulse waveform output at point MCU_ARC, which is typical during normal operating conditions. For illustrative purposes, the single pulse waveform of FIG. 3E is overlaid with a periodic waveform that illustrates the relative periodic timing of the AC signal of the power supply. As depicted, there is no multi-pulse phenomenon during normal operation. Further, under certain operating condition such as switching a power supply on or off or operating dimmer lighting, a multi-pulse condition would be limited to a relatively short amount of time, for example two pulse periods (corresponding to one period of the AC current).

Figure 3F:
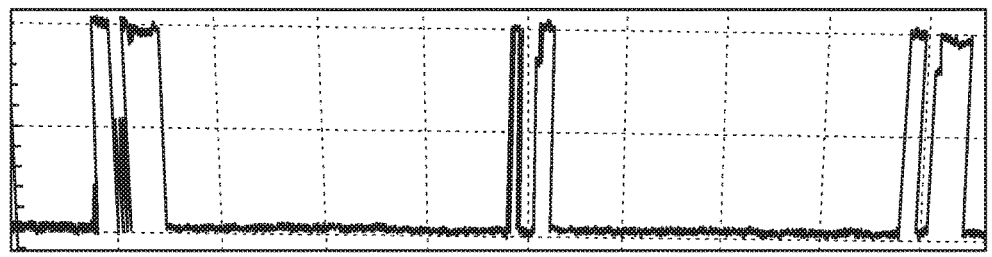

FIG. 3F illustrates a measured multi-pulse waveform at point MCU_ARC that may correspond to an arc occurrence. When an arc fault exists, there would abnormal introduction of multi-pulse situation, and such multi-pulse condition would continue more than two pulse periods (corresponding to one period of the AC current) or even longer. The presence of such a prolonged multi-pulse signature, as evaluated by MCU 215, is a strong indicator of the existence of an arc fault.

Figure 3G:
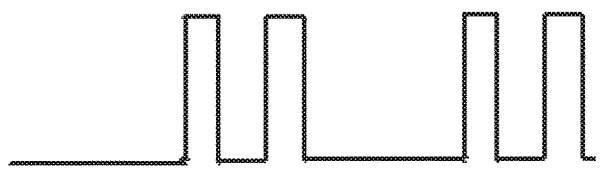

FIG. 3G illustrates an arc simulation signal—a simulated multi-pulse waveform that may be generated at point MCU_SIMULATION for a system self-test. During such self-test, the simulated multi-pulse signature will proceed through multi-pulse detection block 213 to MCU_ARC. If the AFCI is working correctly, the simulated signal should be read as a multi-pulse signature by MCU 215. If the simulated signature does not register as a multi-pulse signature, an AFCI outlet 100 is determined to be in an end-of-life condition.

When an arc fault exists, there would be an abnormal introduction of multi-pulse situation, and such multi-pulse condition would continue more than two pulse periods (corresponding to one period of the AC current) or even longer. The presence of such a prolonged multi-pulse signature, as evaluated by MCU 215, is a strong indicator of the existence of an arc fault.

Figure 2D:
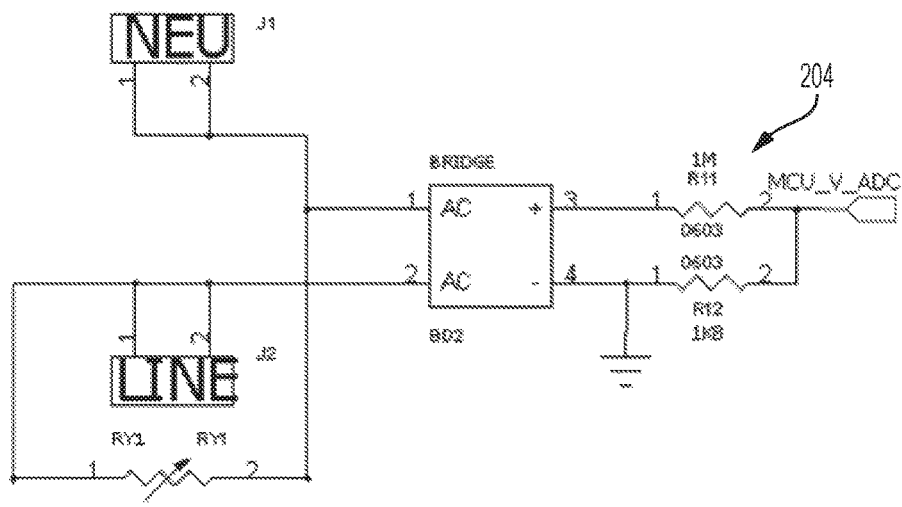
Figure 2E:
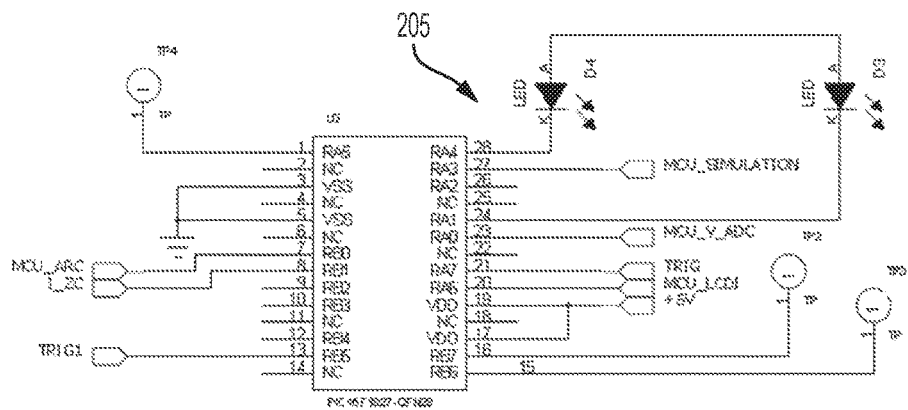
Figure 2F:
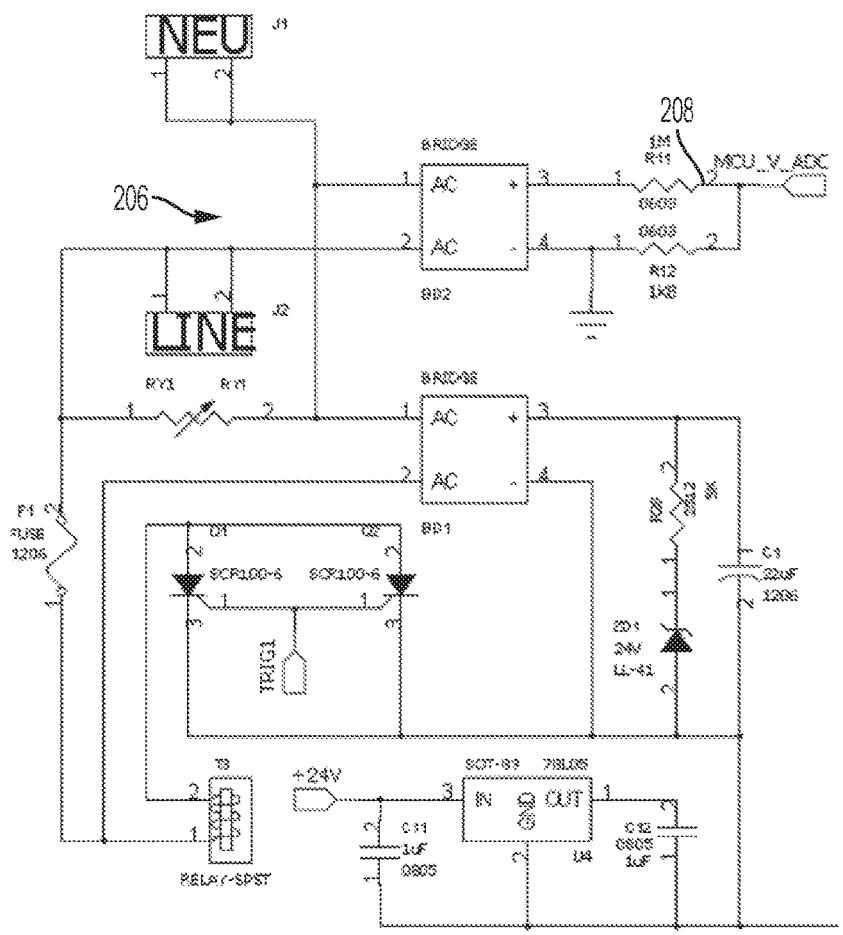

As shown in detail in FIG. 2F, the line input current (LINE) is preferable processed by dual rectification bridge block 216 to extract a desired stabilized operational current. It may be noted that RMS voltage/current measurement block 214 (depicted in detail in FIG. 2D) may comprise a portion of dual rectification bridge block 216. With reference to FIGS. 2D and 2F, second rectification bridge 8 provides a stabilized operational voltage/current for AFCI circuit 200 operation. Under normal conditions, voltage output at point MCU_V_ADC may resemble that of FIG. 3A. FIG. 3K illustrates typical voltage and current waveforms measured at MCU_V_ADC in a parallel arcing condition. The voltage and current waveforms measured at point MCU_V_ADC are substantially the same during series arcing. However, during parallel arc the respective amplitude of the voltage will be reduced due to high current consumption.

Figure 2G:
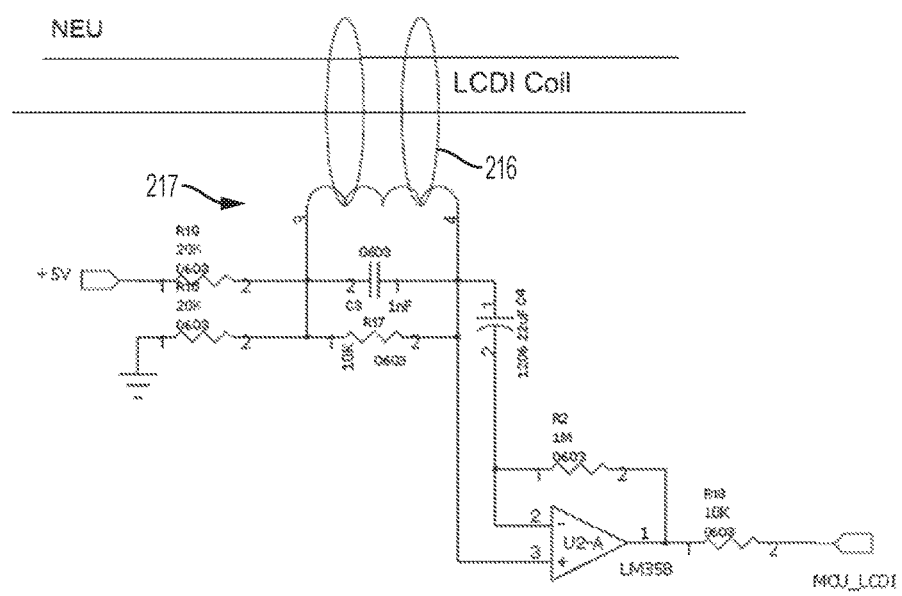

As depicted in detail in FIG. 2G, AFCI circuit 200 may further include Leakage Current Detection Indicator (LCDI) circuit 217. As with conventional GFCIs, LDCI 17 operates by measuring an imbalance between the line input current (LINE) and the neutral return current (NEU) passing through a LCDI coil 216. When current improperly flows to ground, for example through a person or a faulty appliances, such a leakage current will cause a significant imbalance condition between the input line current and the neutral return current. Such an imbalance with cause LCDI circuit 217 to provide a fault signal on point MCU_LCDI, for example as shown in FIG. 3J. The signal at MCU_LCDI is ultimately provided to MCU 215, which may assess the signal to make a ground fault determination and, if appropriate, engage the tripping mechanism. Alternatively, a discrete dedicated functional Integrated Circuit (IC), as known in the art, or another suitable leakage detection or ground fault detection circuit may be substituted for LCDI 217.

Figure 2H:
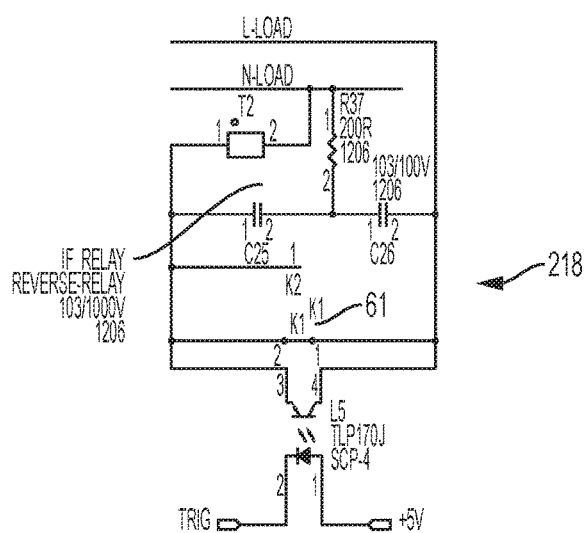

As depicted in detail in FIG. 2H, AFCI circuit 200 may further include a relay circuit 218 that may be used to trip the AFCI circuit. Relay circuit may include switch K1 61, as further indicated in FIG. 5A. As would be understood by the skilled artisan, FIG. 2B depicts a tripped AFCI circuit 200 is tripped, where K1 61 is in a closed state, and thereby supplies the reverse relay with power. As would further be understood by the skilled artisan, K1 61 may be open when the AFCI circuit 200 is in a reset state.

As depicted in detail in FIG. 2E, MCU 215 ultimately receives the signal provided at MCU_LCDI and the various arc detection signatures discussed above. MCU 215 may be understood as key operating platform and software-based decision-making unit for the AFCI circuit 200. That is, MCU 215 may determine the presence and/or classification of an arc fault as a function of a time-domain signature, for example cycle characteristics; a pulse signature; a RMS voltage signature; and/or an RMS current signature. For example, if MCU 215 determines each of the (a) time-domain signature, (b) pulse signature, and (c) RMS current signature meet or exceed preprogrammed thresholds or requirements, it may determine that an arc condition exists. Further, by comparing the RMS voltage signature to at least another preprogrammed threshold, MCU 215 may determine whether an arc condition is a series or parallel arc: An RMS voltage amplitude above a certain threshold may indicate a parallel arc, and an RMS voltage amplitude below a certain threshold may indicate a series arc.

In another example, it may be determined that a series arc exists where (a) the RMS current signature exceeds a preprogrammed threshold, such as above 5 A, and (b) the time-domain signature has a duty cycle above a detection threshold, such as above 60%, for (c) a duration of at least eight half cycles.

Such preprogrammed thresholds may be determined by laboratory tests. For example, the threshold values that govern arc fault assessment may be adjustable and, in some embodiments, may be calibrated to reflect each batch of components used to assemble a particular manufacturing run of AFCI devices. For example, such batch-specific calibration may be necessary to assure that improper arc fault assessments (including false alarms) are kept to a minimum and/or to comply with various desired industrial certifications.

Figure 3H:
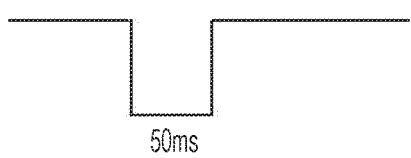
Figure 3I:
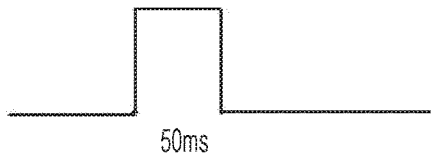
Figure 3J:
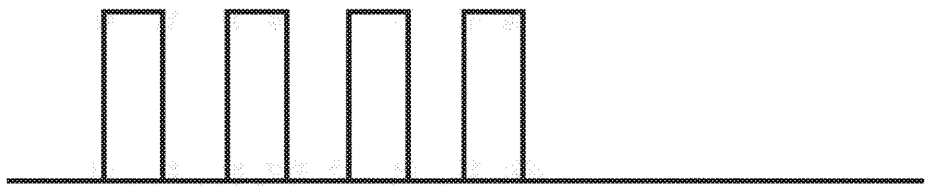
Figure 3K:
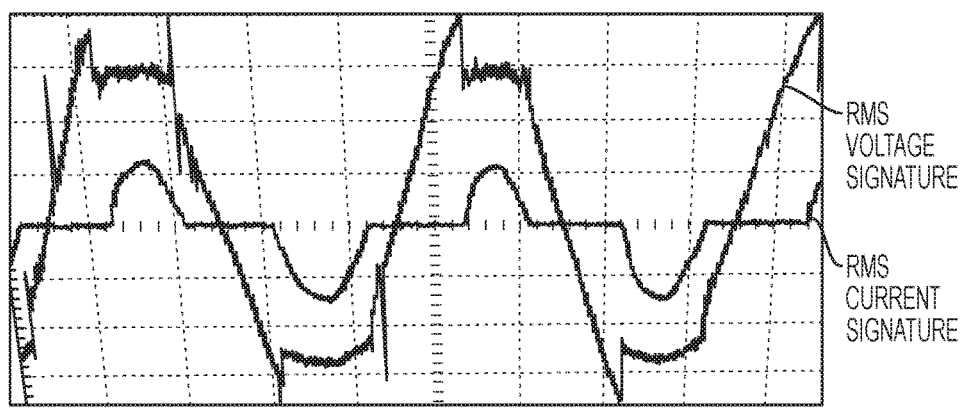

When appropriate, for example, when an arc fault is detected, MCU 215, may provide a signal via TRIG, as depicted in FIG. 3H, to at least temporarily remove power provided to the reverse relay of FIG. 2F and thereby trip the AFCI device via relay module 37, as discussed below. This ultimately may place the AFCI in a tripped condition, whereby the supply of power through an AFCI device is halted. If appropriate, for example, when an EOL condition is determined, AFCI circuit 200, may, provide a signal via TRIG1, as depicted in FIG. 3I, to safety lock coil module 25, which is depicted at Relay T3 in FIG. 2H. As discussed below, providing such a signal, may cause an AFCI device to enter an EOL state.

Figure 4A:
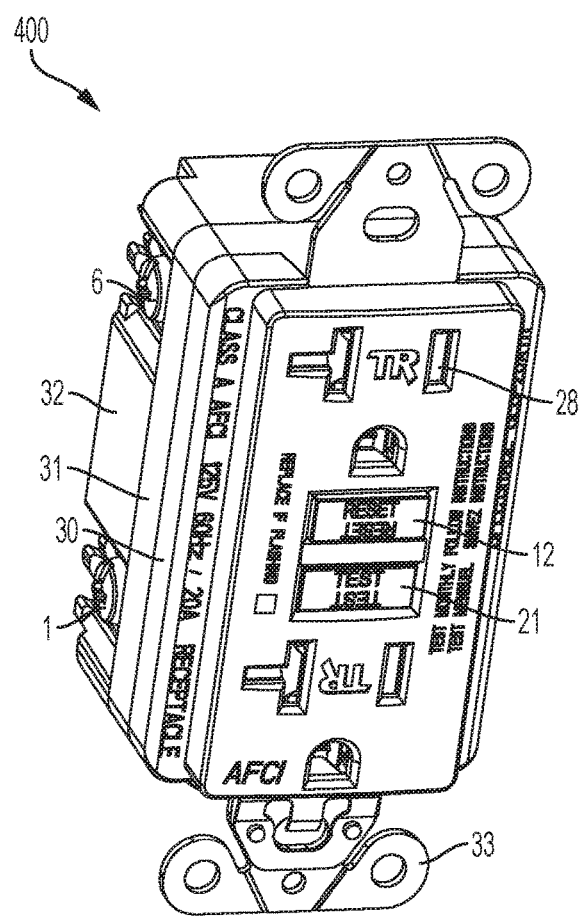
FIGS. 4A-4G are perspective, front, side, back, bottom, exploded, and further exploded views, respectively of an embodiment of an AFCI receptacle outlet, consistent with the present disclosure.
Figure 4B:
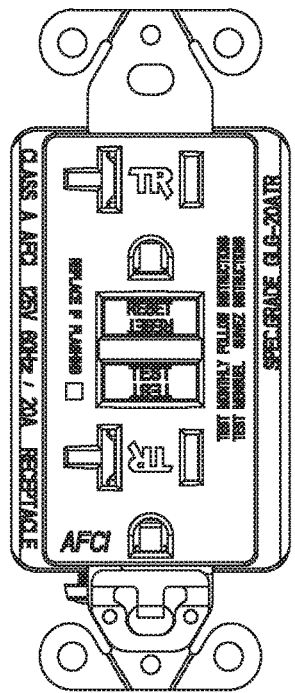
Figure 4C:
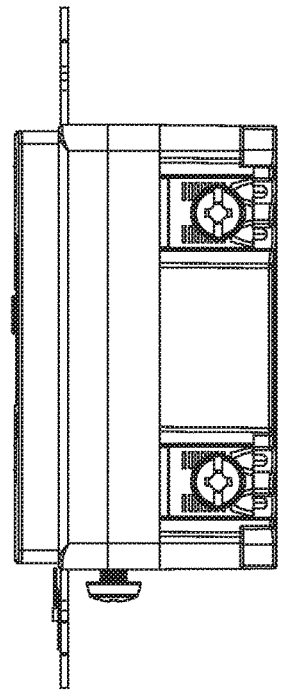
Figure 4D:
Figure 4E:
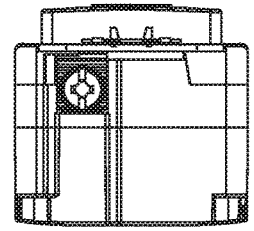
Figure 4F:
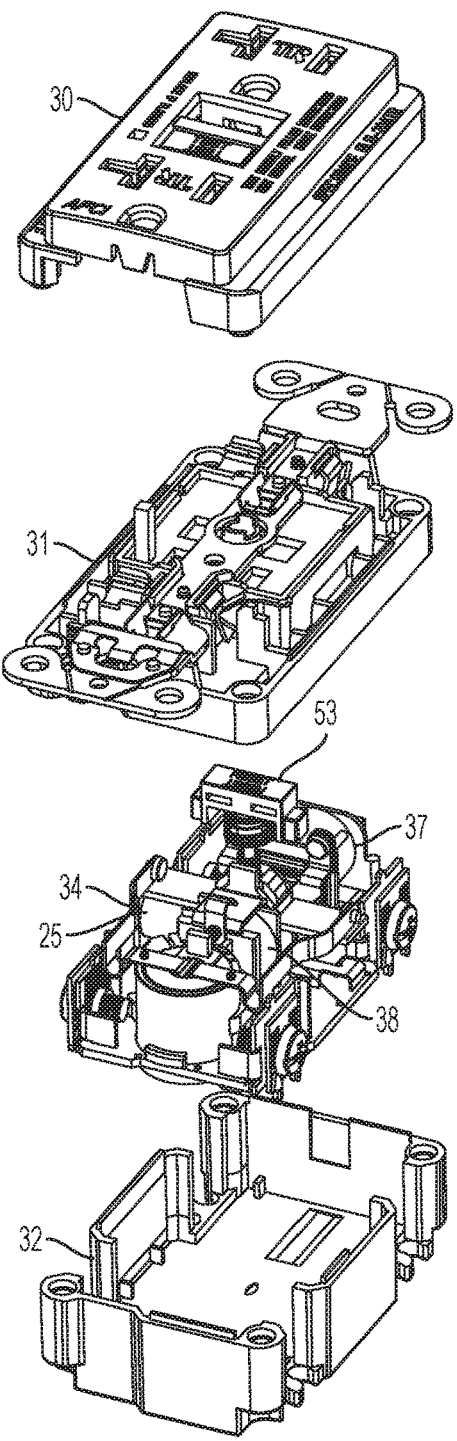
Figure 4G:
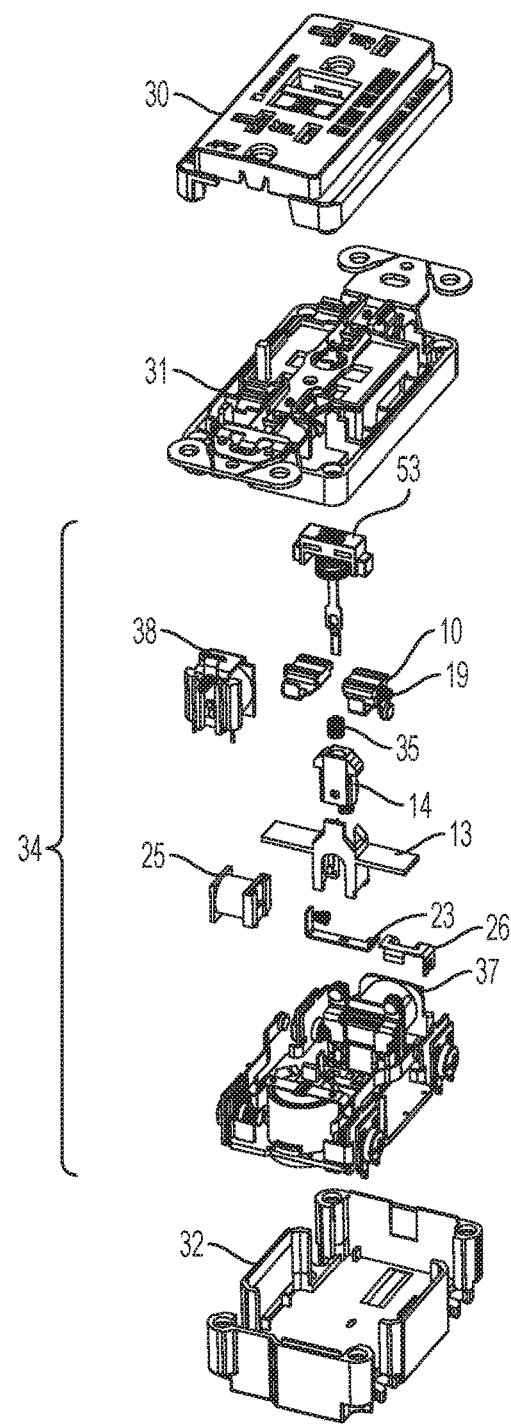
Figure 4H:
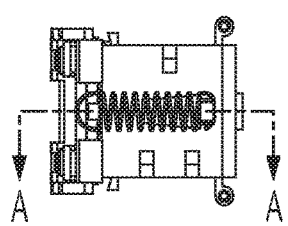
FIGS. 4H-4J are bottom, cross-sectional, and back views, respectively, of a relay module of the embodiment of FIGS. 4A-4G.
Figure 4I:
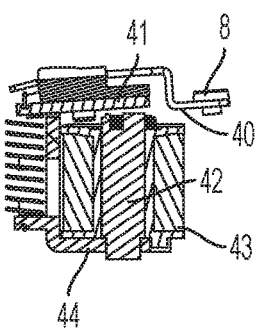
Figure 4J:
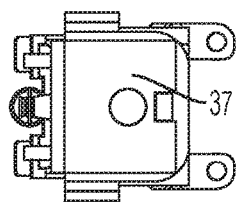
Figure 4K:
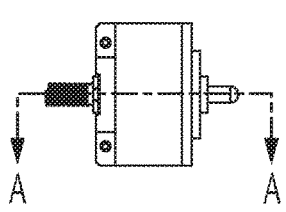
FIGS. 4K-4M are bottom, cross-sectional, and front views, respectively, of a trip coil of the embodiment of FIGS. 4A-4G.
Figure 4L:
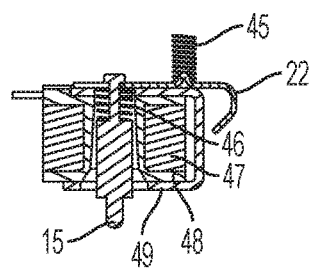
Figure 4M:
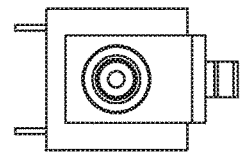
Figure 4N:
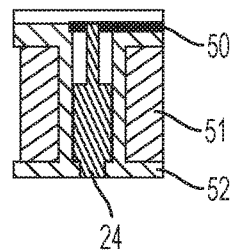
FIGS. 4N and 4O are cross-sectional and side views, respectively, of a safety lock coil module of the embodiment of FIGS. 4A-4G.
Figure 4O:
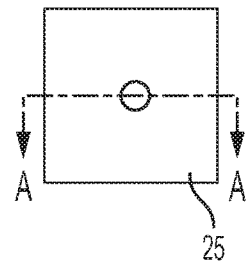
Figure 4P:
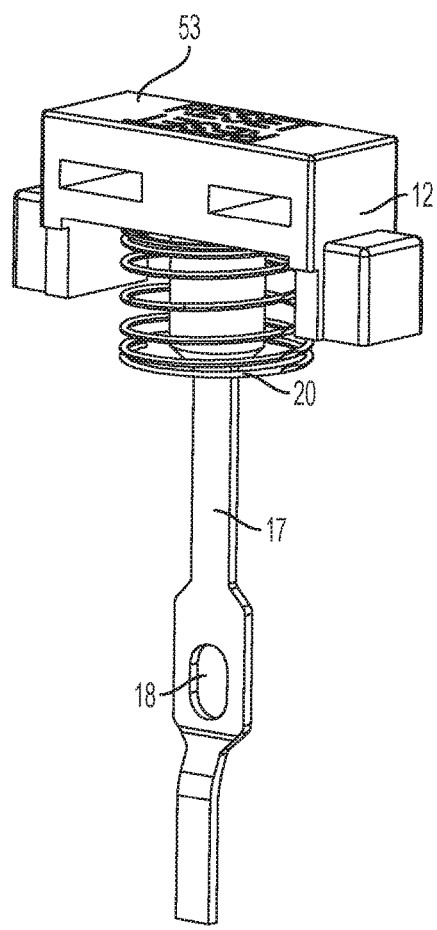
FIG. 4P is a perspective view of a reset button module of the embodiment of FIGS. 4A-4G.
Figure 4Q:
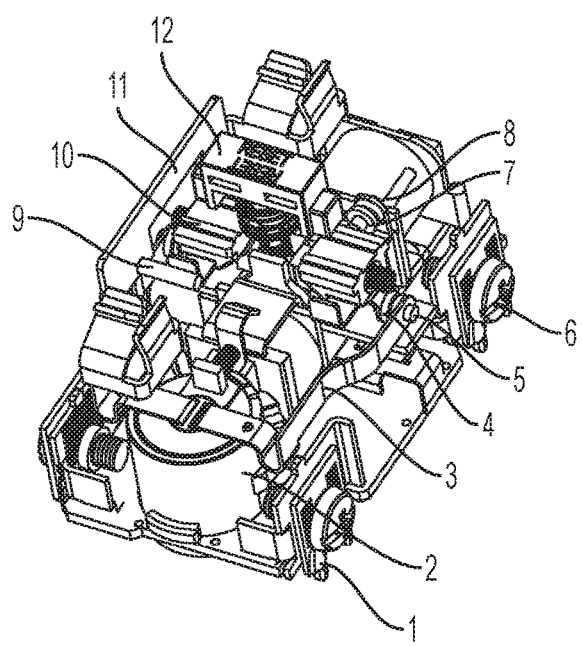
FIG. 4Q is a perspective view of a mainboard module and other modules of the embodiment of FIGS. 4A-4G.

With reference to FIGS. 4A-4Q, the physical structure of a preferred embodiment of an AFCI outlet 100 containing AFCI circuit 200 is disclosed. Although AFCI outlet 100 is discussed in detail as an example, AFCI circuit 200 and other technologies disclosed herein may be adapted for use in AFCI circuit breakers to be placed in fuse boxes or the like, as would be understood by persons of skill in the art.

With reference to FIG. 4A, which is a perspective view of an uninstalled AFCI outlet 100, the outlet may comprise an input connector module 1 to connect the input current line, an output connector module 6 to connect the neutral line, a ground 33, a face casing 30, a middle frame 31, and a bottom casing 32. The face casing may provide access to electrical jacks 28, reset button 12, and test button 21. FIGS. 4B-4E provide additional views of uninstalled outlet 100.

FIG. 4F provides an exploded view of AFCI outlet 100, which further depicts mainboard module 34, which is disposed between and is substantially enclosed by middle frame 31 and bottom casing 32. As shown, mainboard module 34 is integrated with reset button module 53, trip coil module 38, safety lock coil module 25, and relay module 37.

FIG. 4G provides a further exploded view of AFCI outlet 100. As depicted, mainboard module 34 may further comprise safety lock buckle 26, safety lock 23, reset rack seat 13, slider 14, slider spring 35, sliding bar spring 19, and sliding bar 10.

FIGS. 4H-4J provide additional detail of relay module 37 via bottom, cross-sectional, and back views, respectively (with reference to positioning in FIG. 4G). Relay module 37 may include relay movable contact 8, relay movable contact pad 40, relay attraction plate 41, relay iron core 42, relay coil 43, relay rack 44, and relay spring 54.

FIGS. 4K-4M provide additional detail of trip coil module 38 via bottom, cross-sectional, and front views, respectively (with reference to positioning in FIG. 4G). Trip coil module 38 may include trip steel piece spring 45, trip steel piece 22, trip iron core spring 46, trip coil 47, trip coil frame 48, trip attraction plate 49, and trip iron core 15.

FIGS. 4N and 4O provide additional detail of safety lock coil module 25 via cross-sectional and side views, respectively (with reference to positioning in FIG. 4G). Safety lock coil module 25 may include safety lock coil attraction plate 50, safety lock coil 51, safety lock coil frame 52, and safety lock iron core 24. FIG. 4N depicts safety lock coil module in an unactivated configuration.

FIG. 4P provides additional detail of reset button module 53 via a perspective view. Reset button module 53 may comprise reset button 12, reset spring 20, and reset rod 17 with reset rod locking hole 18.

FIG. 4Q provides additional detail of mainboard module 34 and other modules via a perspective view. As shown, AFCI outlet 100 may additionally include magnetic seat 2, input connection element 3, sliding bar movable contact 4, input static contact 5, static pad static contact 7, connecting wire 9, and static pad 11.

With reference to FIGS. 5A-5H, certain operations of a preferred embodiment of an AFCI outlet 100 are described.

Figure 5A:
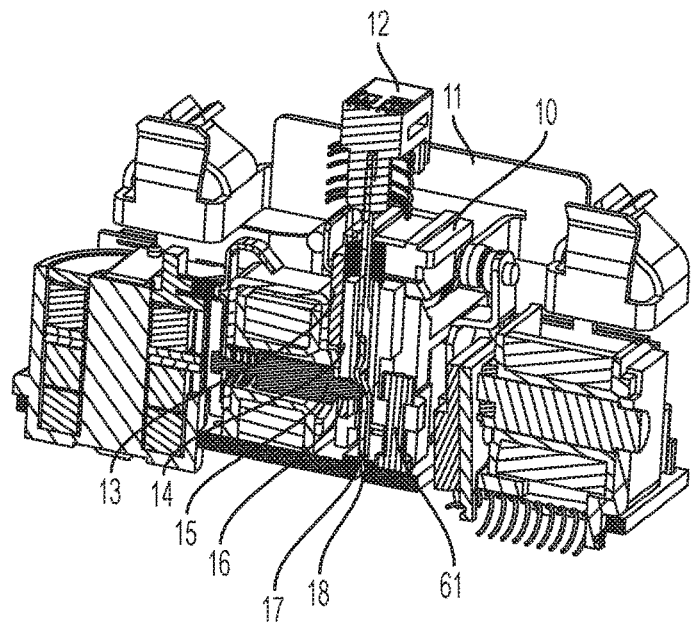
FIGS. 5A-5H are cross-sectional perspective views of the embodiment of FIGS. 4A-4G that illustrate various device states, consistent with the present disclosure.
Figure 5B:
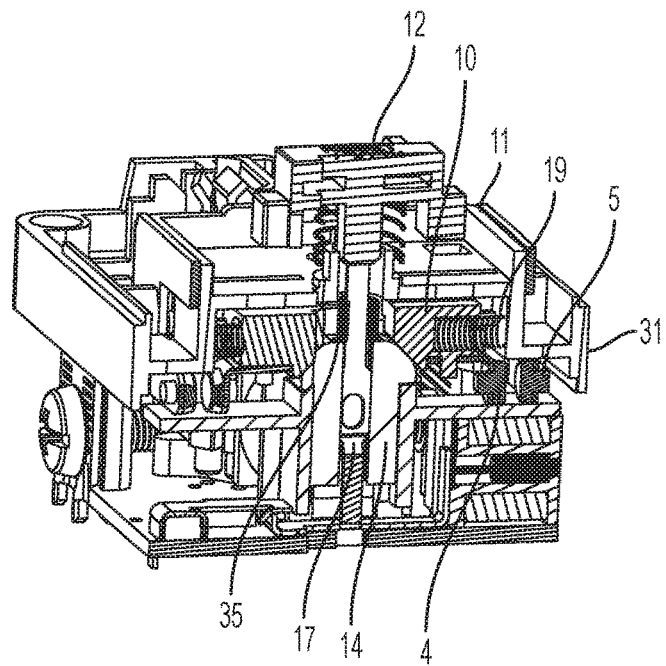

FIGS. 5A and 5B are cross-sectional views of components of electrical outlet 100. Theses figures illustrate the initial, tripped state, non-conductive of an exemplary AFCI outlet 100. Due to force exerted by reset spring 20, the reset button 12 is in its top position, wherein it is fully extended towards and may be at least partially extended through face casing 30 (not shown). The tip of trip iron core 15 is positioned within linkage hole 16 of slider 14 and preferably abuts an inclined portion of reset rod 17, just below reset rod linking hole 18. Slider 14 is maintained at the bottom of reset rack seat 13. Due to the force of sliding bar springs 19, sliding bars 10 are located at their inner positions. Sliding bar movable contacts 4 are attached to each of the sliding bars 10, respectively. As such, when sliding bars 10 are located at their inner positions, respectively, input static contacts 5 are separated from their corresponding sliding bar movable contacts 4. This separation maintains a non-conductive state of outlet 100 and prevents the supply of electric power from input connector module 1 through jacks 28.

Figure 5C:
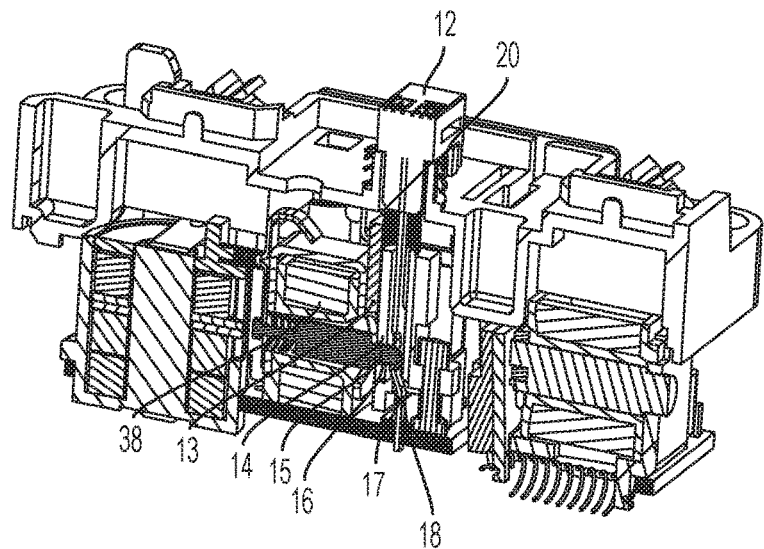
Figure 5D:
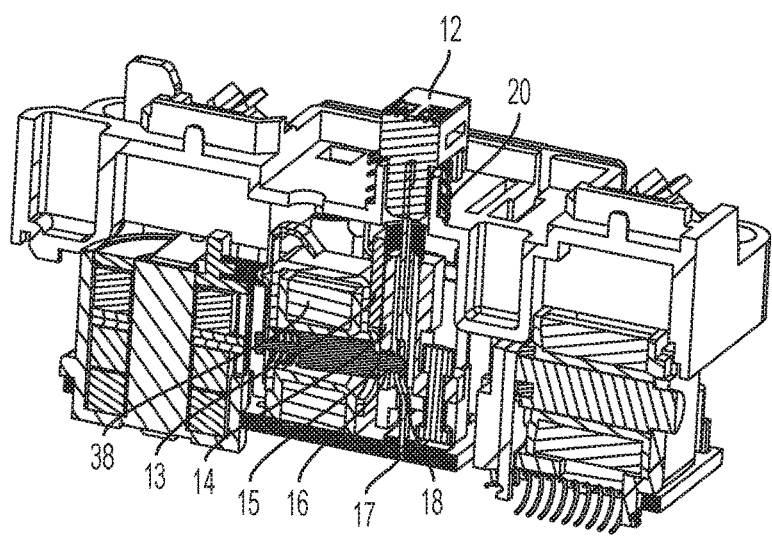
Figure 5E:
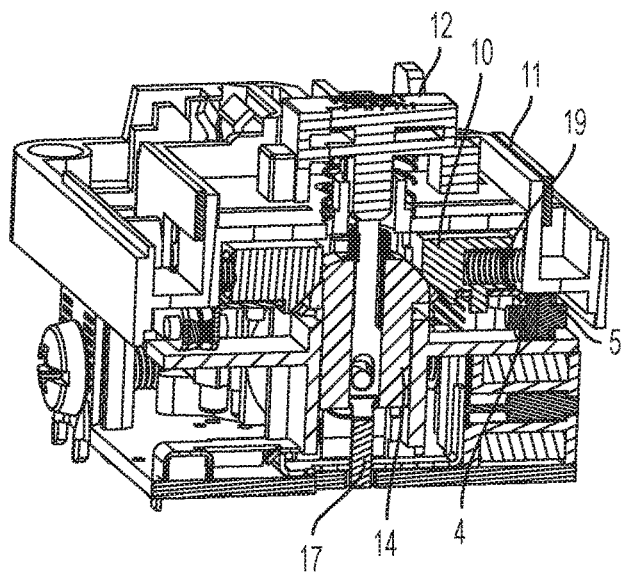

FIGS. 5C-5E are cross-sectional views of components of electrical outlet 100 that illustrate the reset activation process in the circumstance where AFCI 100 is wired correctly. As shown in FIG. 5C, when reset button 12 is manually pressed, reset button module 53, including reset rod 17, moves downward, bringing reset rod locking hole 18 into substantial alignment with trip iron core 15. Thus, due to force exerted by trip iron core spring 46, the tip of trip iron core 15 slides into reset rod locking hole 18. As shown in FIGS. 5D and 5E, after reset button 12 is released, reset spring 12 pushes reset module 53 back into its top position. As shown, due to the engagement of the trip iron core 15 with both reset rod locking hole 18 and linkage hole 16 of slider 14, slider 14 is brought upward into a top position along with reset button module 53. As a result, the inclined faces of slider 14 exert pressure on the corresponding inclined faces of sliding bar 10. In turn, the sliding bars 10 are pushed outward toward the sides of outlet 100, compressing their respective sliding bar springs 19. Ultimately, this outward movement causes sliding bar movable contacts 4 to respectively contact corresponding input static contacts 5. Upon such contact, outlet 100 may be placed in a conductive, reset state: Electric power may be provided from input connector module 1 through jacks 28.

Figure 5F:
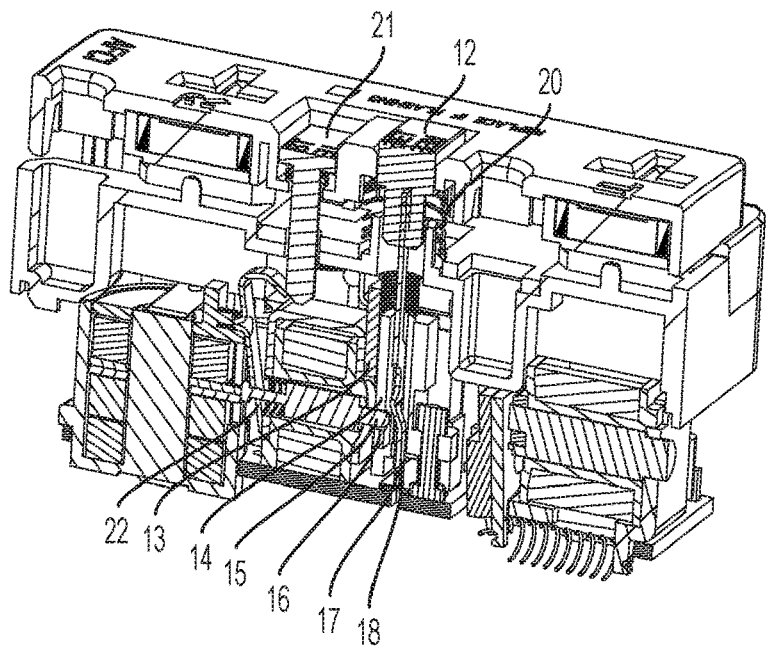
Figure 5G:
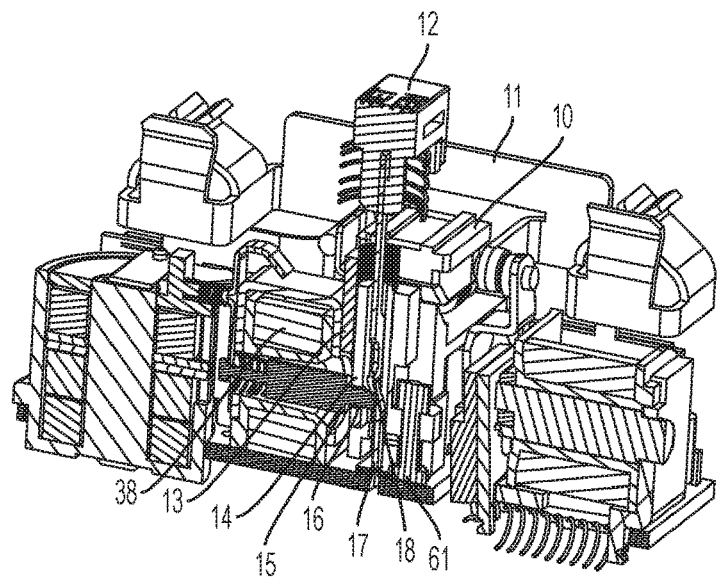

FIGS. 5F and 5G are cross-sectional views of electrical outlet 100 and components thereof, respectively, that illustrate tripping operation resulting from detection of an electrical fault, such as current leakage or a current arc, or a test to ensure a proper fault response. Upon determining the presence of an electrical fault MCU 215 provides a trigger signal TRIG1 (as shown in FIG. 2F) that ultimately creates an electromagnetic force that, as shown in FIG. 5G, causes trip iron core 15 to retract against the force of trip iron core spring 46. As a result, the tip of trip iron core 15 disengages from reset rod locking hole 18, thereby disengaging slider 14 from reset button module 53, and permitting slider 14 to move to the bottom of reset rack seat 13 under pressure of slider spring 35. In turn, sliding bars 10 and their respective sliding bar movable contacts 4 return to their inner positions, which separates sliding bar movable contacts 4 from input static contacts 5, and halts the supply of power from input connector module 1 to jacks 28.

As shown in FIG. 5F, manually pressing test button 21 can mechanically trip AFCI outlet 100. Such a force trigger mechanical testing mechanism may preferably be available for triggering testing even when an AFCI device is not powered or installed. Pressing test button 21 downward causes trip steel piece 22 to partially pull away from steel attraction plate 49, which, in turn, physically pulls trip iron core 15 backward. In turn, this removes the tip of trip iron core 15 from reset rod locking hole 18. As discussed above, with reference to FIG. 5G, this trips the AFCI outlet 100 and prevents the supply of electrical power from input connector module 1 to jacks 28.

Figure 5H:
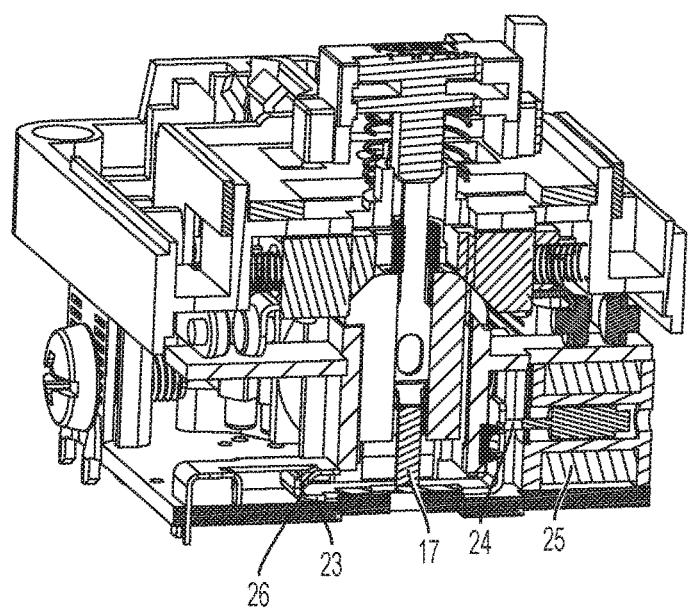

FIG. 5H is a cross-sectional view of components of AFCI outlet 100 that illustrates an end-of-life state, whereby outlet 100 is in a permanent tripped/non-conductive state. Upon determining that outlet 100 should be place in an EOL state, MCU 215 may provide a trigger signal, TRIG1, that ultimately creates an electromagnetic force that causes trip iron core 15 to retract against the force of trip iron core spring 46. As discussed above, this prevents the supply of electrical power to jacks 28 similarly to that discussed with respect the examples of FIGS. 5F and 5G above.

Figure 5I:
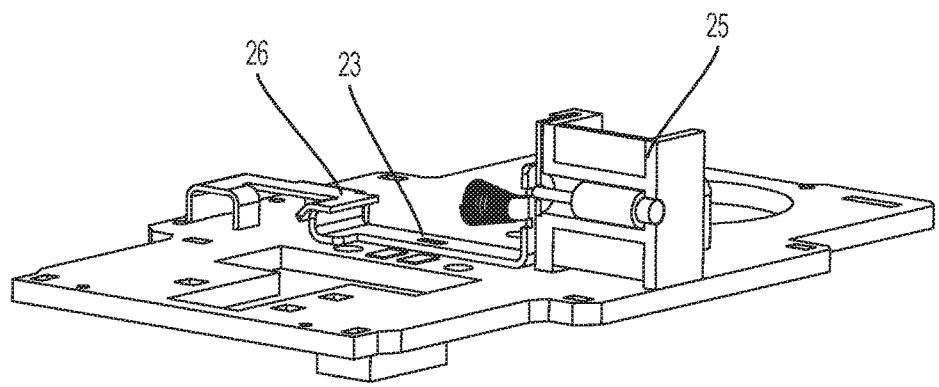
FIGS. 5I-5J are partial perspective views of the embodiment of FIGS. 4A-4G that illustrate exemplary structure and operation of safety lock mechanisms, consistent with the present disclosure.
Figure 5J:
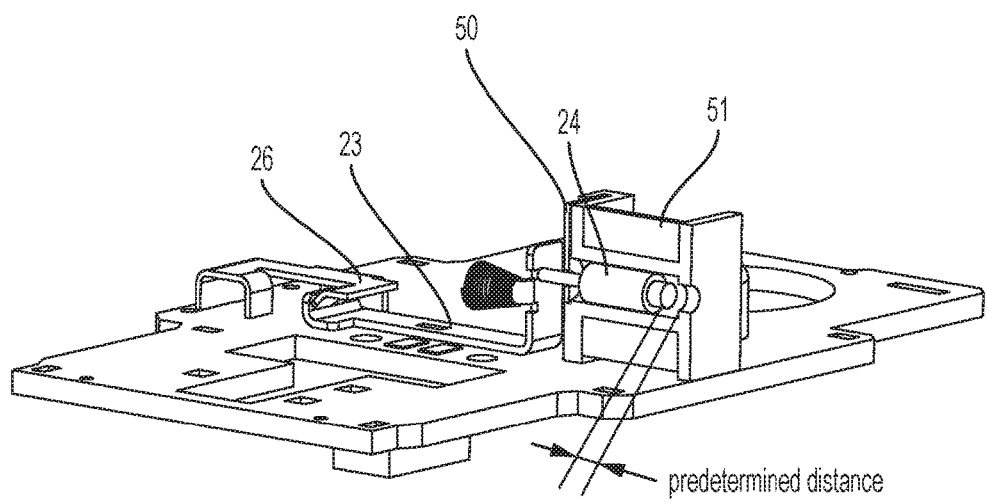

Simultaneously, or subsequently, MCU 215 may provide another trigger signal, TRIG. As shown in FIGS. 5I and 5J, this activates the safety lock coil 51, causing the safety lock iron core 24 of safety lock coil module 25 to travel a predetermined distance and partially push through a gap in safety lock coil attraction plate 50. Safety lock iron core 24 pushes the safety lock 23 into safety lock buckle 26. Safety lock 23 and safety lock buckle 26 engage, blocking the downward movement of reset button module 5 and thereby preventing any further resetting of the tripped, disconnected AFCI outlet 100. Thus, a permanent EOL state may be achieved.

Figure 1:
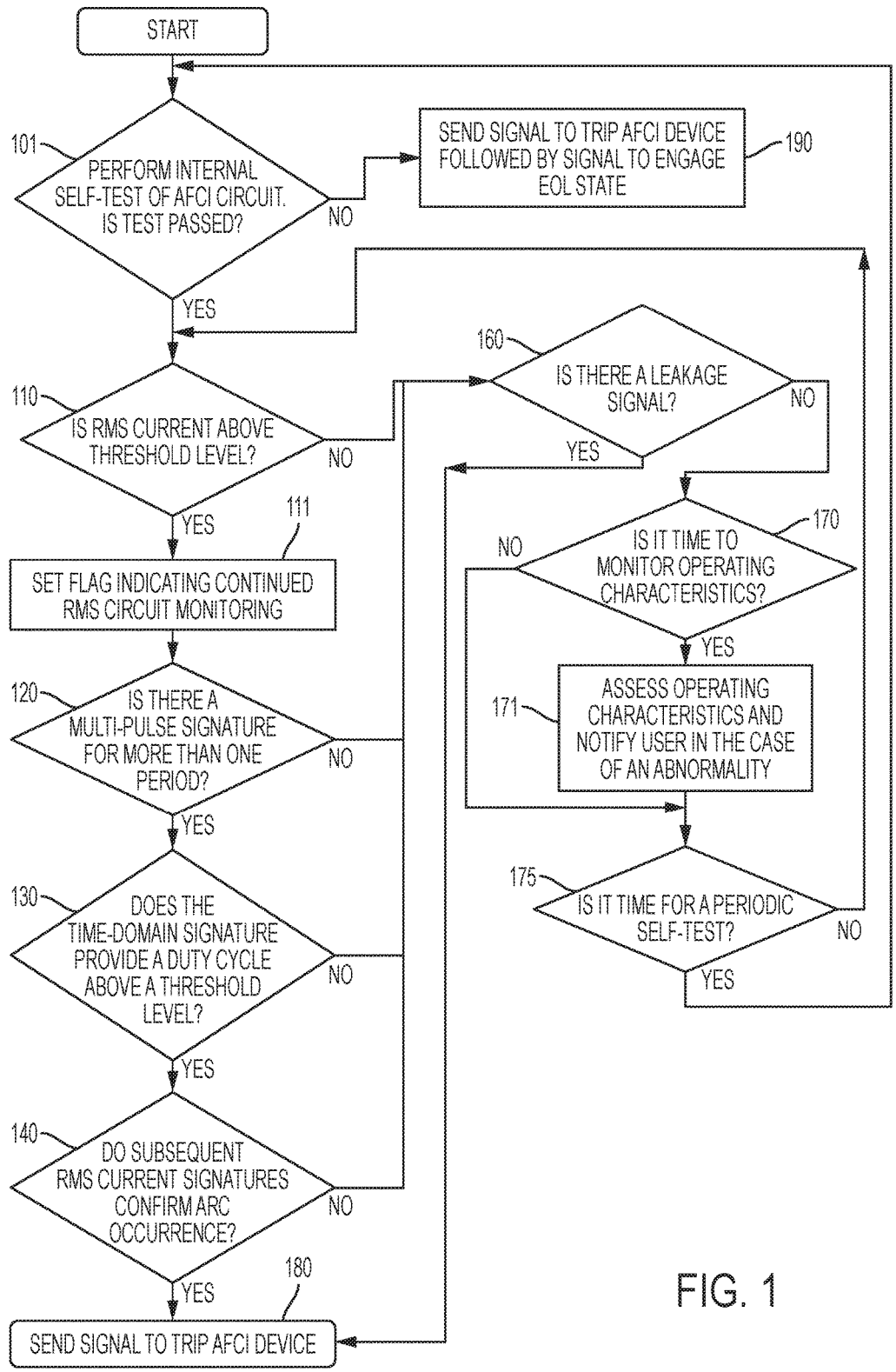
FIG. 1 is a flow diagram of an exemplary method of operation for a processor in an AFCI circuit, consistent with the present disclosure.

FIG. 1 provides an exemplary algorithm for arc fault detection and circuit interruption consistent with instant disclosure. Such algorithm may preferably be accomplished by software programmed on MCU 215 of exemplary AFCI circuit 200 or the like. More generally, the steps of this algorithm may be performed by a computing device, in concert with other elements of AFCI Circuit. Software embodying the algorithms may be stored in non-volatile storage and/or memory within or outside of a processing device and may be executed by the processing device. As would be apparent to persons of skill in the art, the exact order of certain steps of the disclosed exemplary algorithm embodiments may be altered while still practicing the disclosed algorithms. Similarly, certain steps of the disclosed algorithm embodiments may be substituted, combined, or removed while still practicing the disclosed algorithms—consistent with the disclosure herein and/or as would be apparent to persons of skill in the art.

As in step 101, MCU 215 may perform a self-test of AFCI circuit 200 upon power up. Primarily, this may comprise sending an arc simulation signal to MCU_SIMULATION, to assure that the pulse signal response is appropriate. If MCU 215 identifies the presence of an arc fault in response to the arc simulation signal, the self-test may be considered passed. MCU 215 may then indicate that the AFCI circuit 200 is normally operating by energizing, for example, a sold green LED indicator that is preferably visible on the face of the AFCI device. If the test is passed, the process may proceed to step 110. However, if the AFCI circuit 200 fails the internal self-test, the AFCI outlet 100 has been determined to have reached its end of life and may proceed to step 190.

As in step 190, MCU 215 delivers a triggering pulse or activation signal, e.g., TRIG1, to trigger the relay contact and trip the AFCI, as well as a second triggering pulse or activation signal, e.g., TRIG, to place the tripped AFCI in an EOL state via safety lock coil module 25, as described above with respect to FIG. 5H. Further, an alert indication of, for example, a solid red LED may be activated to signify a fault. Once in the EOL state, the device will not be able to be reset or return back to normal operation and the process is ended.

As in step 110, MCU 215 may assess the RMS current signature. If, for example, the RMS current signature is above a detection threshold, for example, 5 A, it may be determined that a series arc is possibly occurring. In some embodiments, as shown in step 111, when an above-threshold RMS current is detected in a first half cycle (of the AC current), MCU 215 may set a flag to internally indicate that monitoring of the RMS current should continue for the measurement period. Such a measurement period may be, for example, eight half-cycles. The process may proceed to step 120. If however, the RMS current signature is not above a detection threshold, it may be determined that no arc condition is occurring, and the process may proceed to step 160.

As in step 120, MCU 215 may assess the pulse signature. If, for example, there is a multi-pulse signature for more than one AC period, it may be determined that an arc is likely occurring. If so, the process may proceed to step 130. If however, the pulse signature is not a multi-pulse signature for more than one period, it may be determined that no arc condition is occurring, and the process may proceed to step 160.

As in step 130, MCU 215 may assess the time-domain signature. If, for example, the time-domain signature provides a duty cycle above a detection threshold, for example, 60%, it may be determined that an arc is occurring. However, at this step, MCU 215 may also cross-reference the time-domain signature with pre-supplied values that maybe indicative of electrical phenomena other than arcing, such as, switching a power supply, or using a dimmer switch. If the time-domain signature is determined to be indicative of an arc occurrence, the process may proceed to step 140. If not, the process may proceed to step 160.

As in step 140, MCU 215 may assess the RMS current signatures over multiple half-cycles, comparing them with threshold values to confirm that the RMS current signature is indicative of an arc occurrence. For example, a high RMS current signature could indicate an inrush of current resulting from electrical equipment being plugged into the AFCI or the like. In such a case—but not in the case of an arc—the RMS current signature will decrease over successive half cycles. Thus, in preferred embodiments, MCU 215 may confirm the presence of an arc where an above-threshold RMS current signature is found on the second or third period of AC current since the flag was set. If the RMS current signatures are confirmed to indicate of an arc, the process may proceed to step 180. If not, the process may proceed to step 160.

As in step 160, MCU 215 may monitor for a leakage current signal. If there is a leakage current signal, then MCU 215 may energize the alert red LED indicator and send a trigger signal, e.g., TRIG1, to trip the AFCI device, as in step 180. In the absence of a leakage current signal, the process proceeds to step 170.

As in step 170, MCU 215 may determine whether it is time to monitor operating characteristics of the AFCI device. In preferred embodiments, such monitoring may occur on a 10-15 minute interval. The monitoring interval may be programmed into MCU 215. If it is time for monitoring, the process proceeds to step 171; otherwise the process proceeds to step 171.

As in step 171, MCU 215 may monitor various operating conditions of the AFCI device, such as input voltage and input current, as well as other pre-defined operating criteria or environmental conditions. In the event of an abnormal operating condition detected during the monitoring process, MCU 215 may indicate such abnormality by, e.g., blinking the alert red LED indicator. This may, in turn, inform a user of the presence of an abnormal operating condition, and, if the blinking persists, that it may be advisable to investigate and repair or replace, e.g., the wiring, power supply, or even the AFCI outlet 100 itself. The process may proceed to step 175.

As in step 175, MCU 215 may determine whether it is time for an automatic, periodic self-test. In preferred embodiments, a periodic self-test will occur on a 2.5 hour interval, or may be between 1 and 3 hours. The self-test interval may be programmed into MCU 215. It may follow UL or other industrial specifications or regulatory requirements. If it is time for a self-test, the process proceeds back to step 101. If not, the process cycles back to continue at step 110.

Figure 6:
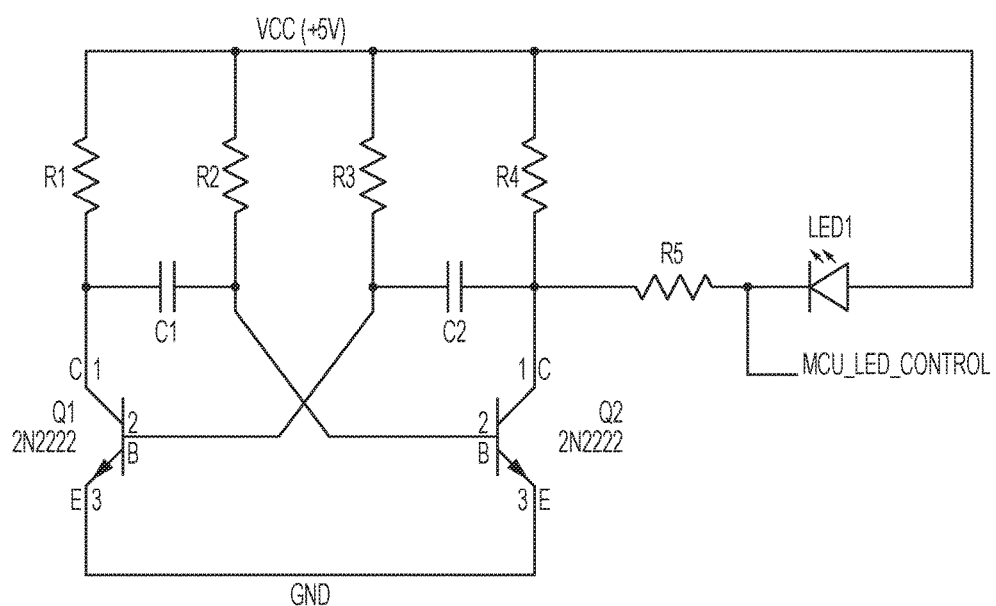
FIG. 6 depicts a circuit diagram of an embodiment of a failsafe circuit for an AFCI, consistent with the present disclosure.

As in step 180, upon a determination that there is a leakage current or arc fault, MCU 215 delivers a triggering pulse or activation signal, e.g., TRIG1, to trigger the relay contact. As described below, with reference to FIG. 5G, the triggering of the relay contact will disconnect the power supply of the AFCI device. The process ends and may restart, at step 101, upon a manual pressing (and release) of the RESET button, as described above with respect to FIGS. 5C-5E In some embodiments, AFCI 100 may additional failsafes to prevent AFCI 100 from providing if power operation if MCU 215 suffers a malfunction. Because the arc fault detection and self-testing described herein may only be reliable with a properly functioning MCU 215, it may be advantageous for AFCI 100 to detect an MCU 215 malfunction, cease providing power, and/or notify a user of the malfunction. To accomplish this, AFCI 100 may further include a simple failsafe circuit that would, as a default, maintain the AFCI in a tripped state and/or provide a continuous alert signal. FIG. 6 illustrates an exemplary embodiment of such a failsafe circuit. The alert signal may, for example cause a red LED of the AFCI to blink indefinitely. MCU 215 may be further programmed to provide a proper operation signal to the failsafe circuit when it is functioning. Upon receipt of the failsafe signal, the failsafe circuit will cease from keeping AFCI 100 in a tripped state and will cease from providing the continuous alert signal.

In the preceding specification, various preferred embodiments have been described with reference to the accompanying drawings. It will, however, be evident that various other modifications and changes may be made thereto, and additional embodiments may also be implemented, without departing from the broader scope of the invention as set forth in the claims that follow.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

We claim:
1. An arc fault circuit interrupter, comprising:
a plurality of current arc signature detection blocks configured to output a plurality of corresponding current arc signatures; and
a processor configured to receive each of the plurality of current arc signatures from each of plurality of current arc signature detection blocks, respectively, determine whether an arc fault exists by assessing each of the plurality of current arc signatures, and generate a first trigger signal if the arc fault is determined to exist,
wherein:
the plurality of current arc signature detection blocks includes a time domain signature block configured to generate a time-domain signature, a multi-pulse detection block configured to generate a pulse signature, and an RMS voltage/current measurement block configured to generate an RMS current signature;
the plurality of corresponding current arc signatures includes the time-domain signature, the pulse signature, and the RMS current signature; and
the processor is further configured to determine that an arc fault exists only if:
a duty cycle of the time-domain signature is below a predetermined duty-cycle threshold;
the RMS current signature exceeds a predetermined RMS current amplitude threshold for an RMS assessment period; and
the pulse signature is characterized by a multi-pulse phenomenon for a pulse assessment period.
2. The arc fault circuit interrupter of claim 1, further comprising:
a relay module configured to trip the arc fault circuit interrupter in response to the first trigger signal;
a reset button module configured to place the tripped arc fault circuit interrupter back into an operating condition.
3. The arc fault circuit interrupter of claim 2, further comprising:
a force trigger testing mechanism configured to trip the arc fault circuit interrupter; and
a test button configured to activate the force trigger testing mechanism even when the arc fault circuit interrupter is unpowered.
4. The arc fault circuit interrupter of claim 1, wherein:
the predetermined duty-cycle threshold is 60%.
5. The arc fault circuit interrupter of claim 1, wherein:
the time domain signature block is configured to generate the time-domain signature over a duration of at least eight half cycles.
6. The arc fault circuit interrupter of claim 5, wherein the pulse assessment period extends for at least one AC period.
7. The arc fault circuit interrupter of claim 1, wherein:
the predetermined RMS current amplitude threshold is 5 A.
8. The arc fault circuit interrupter of claim 7, wherein the RMS assessment period extends for at least two AC periods.
9. The arc fault circuit interrupter of claim 1, wherein the processor is further configured to:
administer a self-test at start-up and cyclically on a self-test interval to determine if the arc fault circuit interrupter is in an end-of-life condition; and
generate the first trigger signal and a second trigger signal if the arc fault circuit interrupter is in the end-of-life condition.
10. The arc fault circuit interrupter of claim 9, wherein the self-test interval is between 1 and 3 hours.

11. The arc fault circuit interrupter of claim 9 further comprising:
a relay module configured to trip the arc fault circuit interrupter in response to the first trigger signal; and
a safety lock coil module configured to place a tripped arc fault circuit interrupter in a permanent end-of-life state in response to the second trigger signal using mechanical means.

12. The arc fault circuit interrupter of claim 11, further comprising:
a reset button module configured to place the arc fault circuit interrupter back into an operating condition if the arc fault circuit interrupter is tripped and not in the permanent end-of-life state.

13. The arc fault circuit interrupter of claim 12, further comprising:
a force trigger testing mechanism configured to trip the arc fault circuit interrupter; and
a test button configured to activate the force trigger testing mechanism even when the arc fault circuit interrupter is unpowered.

14. The arc fault circuit interrupter of claim 1, wherein the processor is further configured to:
administer a self-test to determine if the arc fault circuit interrupter is in an end-of-life condition by:
providing an arc simulation signal to the multi-pulse detection block,
assessing the pulse signature corresponding the arc simulation signal, and
determining that the arc fault circuit interrupter is in an end-of-life condition if the pulse signature corresponding the arc simulation signal is not characterized by a multi-pulse phenomenon for a pulse assessment period; and
generate the first trigger signal and a second trigger signal if the arc fault circuit interrupter is in the end-of-life condition.

15. The arc fault circuit interrupter of claim 1, further comprising an LED, wherein the processor is further configured to:
monitor operating conditions on a monitoring interval to determine if there is an abnormal operating condition; and
provide a signal to the LED if the abnormal operating condition is determined to exist.

16. The arc fault circuit interrupter of claim 15, wherein the monitoring interval is between 10 and 15 minutes.

17. The arc fault circuit interrupter of claim 1, further comprising:
a leakage detection circuit configured to output a leakage detection signal to the processor,
wherein the processor is further configured to generate the first trigger signal if the leakage detection signal is received.

18. An arc fault circuit interrupter, comprising:
a plurality of current arc signature detection blocks configured to output a plurality of corresponding current arc signatures; and
a processor configured to receive each of the plurality of current arc signatures from each of plurality of current arc signature detection blocks, respectively, determine whether an arc fault exists by assessing each of the plurality of current arc signatures, and generate a first trigger signal if the arc fault is determined to exist,
wherein:
the plurality of current arc signature detection blocks includes an RMS voltage/current measurement block is configured to generate an RMS voltage signature; and
if the processor determines that the arc fault exists, the processor is further configured to determine that the arc fault is a parallel arc fault if the amplitude of the RMS voltage signature is above a predetermined RMS voltage amplitude threshold and determine that the arc fault is a series arc fault if the amplitude of the voltage signature is below the predetermined RMS voltage amplitude threshold.

19. A method for detecting an arc fault, comprising:
receiving a time-domain signature;
receiving a pulse signature;
receiving an RMS current signature;
determining that an arc fault exists only if
a duty cycle of the time-domain signature is below a predetermined duty-cycle threshold,
the RMS current signature exceeds a predetermined RMS current amplitude threshold for an RMS assessment period, and
the pulse signature is characterized by a multi-pulse phenomenon for a pulse assessment period;
generating a trigger signal if an arc fault is determined to exist.

20. The method of claim 19, wherein:
the predetermined duty-cycle threshold is 60%.

21. The method of claim 19, wherein:
the pulse assessment period extends for at least one AC period.

22. The method of claim 19, wherein:
the predetermined RMS current amplitude threshold is 5 A.

23. The method of claim 19, further comprising:
receiving an RMS voltage signature; and
if an arc fault is determined to exist, determining that the arc fault is a parallel arc fault if the amplitude of the voltage signature is above a predetermined RMS voltage amplitude threshold and determine that the arc fault is a series arc fault if the amplitude of the voltage signature is below the predetermined RMS voltage amplitude threshold.

24. The method of claim 19, wherein:
the RMS assessment period extends for at least two AC periods.

25. The method of claim 19, further comprising:
administering a self-test at start-up and cyclically on a self-test interval to determine if the arc fault circuit interrupter is in an end-of-life condition; and
generating the first trigger signal and a second trigger signal if the arc fault circuit interrupter is in the end-of-life condition.

26. The method of claim 25, wherein administering the self-test further comprises:
providing an arc simulation signal to the multi-pulse detection block,
assessing the pulse signature corresponding the arc simulation signal, and
determining that the arc fault circuit interrupter is in an end-of-life condition if the pulse signature corresponding the arc simulation signal is not characterized by a multi-pulse phenomenon for a pulse assessment period.

27. The method of claim 19, further comprising:
monitoring operating conditions on a monitoring interval to determine if there is an abnormal operating condition; and
providing a signal to an LED if the abnormal operating condition is determined to exist.

* * * * *